US 011386588B2

(12) United States Patent
Tejima et al.

(10) Patent No.: US 11,386,588 B2
(45) Date of Patent: Jul. 12, 2022

(54) PRODUCT DESIGN SYSTEM AND DESIGN IMAGE CORRECTION APPARATUS

(71) Applicant: SONY CORPORATION, Tokyo (JP)

(72) Inventors: Asuka Tejima, Kanagawa (JP); Yuki Oishi, Kanagawa (JP); Masaru Wada, Kanagawa (JP); Kenichi Kurihara, Kanagawa (JP); Satoko Asaoka, Kanagawa (JP); Yuriko Kaino, Kanagawa (JP); Nobukazu Hirai, Kanagawa (JP); Yusuke Kajio, Tokyo (JP); Aya Shuto, Kanagawa (JP); Taichi Takeuchi, Kanagawa (JP); Isao Takahashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 378 days.

(21) Appl. No.: 16/468,421

(22) PCT Filed: Nov. 17, 2017

(86) PCT No.: PCT/JP2017/041473
§ 371 (c)(1),
(2) Date: Jun. 11, 2019

(87) PCT Pub. No.: WO2018/123340
PCT Pub. Date: Jul. 5, 2018

(65) Prior Publication Data
US 2021/0287406 A1    Sep. 16, 2021

(30) Foreign Application Priority Data

Dec. 27, 2016 (JP) ............................. JP2016-253578

(51) Int. Cl.
*G06T 11/00* (2006.01)
*G06F 30/12* (2020.01)
*G06T 11/60* (2006.01)

(52) U.S. Cl.
CPC ............ *G06T 11/001* (2013.01); *G06F 30/12* (2020.01); *G06T 11/60* (2013.01)

(58) Field of Classification Search
CPC ......... G06T 11/001; G06T 11/60; G06T 1/00; G06F 30/12; G06K 15/1878;
(Continued)

(56) References Cited

U.S. PATENT DOCUMENTS 4,584,601 A * 4/1986 Suzuki ..................... H04N 1/60
358/503
4,668,978 A * 5/1987 Gokita .................. H04N 1/648
399/180
(Continued)

FOREIGN PATENT DOCUMENTS

| JP | 2003-132249 A | 5/2003 |
| JP | 2008-541246 A | 11/2008 |

(Continued)

OTHER PUBLICATIONS

International Search Report and Written Opinion of PCT Application No. PCT/JP2017/041473, dated Jan. 9, 2018, 08 pages of ISRWO.

(Continued)

*Primary Examiner* — Charles L Beard
(74) *Attorney, Agent, or Firm* — Chip Law Group

(57) ABSTRACT

A product design system includes a first transmitting section that uses a look-up table to convert second design image data for which image correction is completed into third design image data of a color space that is represented with a thermochromic material, and transmits the third design image data derived from the conversion to an external apparatus, and a second transmitting section that transmits a
(Continued)

decorating request based on fourth design image data that is profile-transformed from the second design image data to a decorating apparatus.

7 Claims, 11 Drawing Sheets

(58) Field of Classification Search
CPC .......... G06K 15/1807; G06K 15/1822; G06K 15/1825; G06K 15/1868; G06K 15/1882; G06K 15/1884; G06K 15/188; H04N 1/60; H04N 1/6077; H04N 1/04; H04N 1/6027; H04N 1/6086; H04N 1/6094; H04N 1/6097; H04N 2201/0094; H04N 1/00018; H04N 1/00023; H04N 1/46
See application file for complete search history.

(56) References Cited

U.S. PATENT DOCUMENTS

| | | | | |
|---|---|---|---|---|
| 4,719,490 A * | 1/1988 | Yoshida | ............... | H04N 1/60 358/518 |
| 4,786,917 A * | 11/1988 | Hauschild | ............... | H04N 1/58 347/172 |
| 4,849,775 A * | 7/1989 | Izumi | ............... | H04N 1/6052 347/172 |
| 4,862,255 A * | 8/1989 | Takanashi | ............... | B41J 2/32 358/518 |
| 5,199,081 A * | 3/1993 | Saito | ............... | H04N 1/46 345/634 |
| 5,245,419 A * | 9/1993 | Gu | ............... | H04N 1/60 358/448 |
| 5,278,641 A * | 1/1994 | Sekizawa | ............... | H04N 1/60 382/167 |
| 5,317,678 A * | 5/1994 | Okawara | ............... | G06T 11/001 345/426 |
| 5,513,014 A * | 4/1996 | Kariya | ............... | H04N 1/2307 358/448 |
| 5,521,722 A * | 5/1996 | Colvill | ............... | G06F 3/1208 101/211 |
| 5,576,847 A * | 11/1996 | Sekine | ............... | G06T 11/60 358/448 |
| 5,604,566 A * | 2/1997 | Mano | ............... | G03B 27/32 355/53 |
| 5,710,872 A * | 1/1998 | Takahashi | ............... | H04N 1/60 358/1.9 |
| 5,729,624 A * | 3/1998 | Tanioka | ............... | H04N 1/60 382/199 |
| 5,864,342 A * | 1/1999 | Kajiya | ............... | G06T 11/001 345/418 |
| 5,881,211 A * | 3/1999 | Matsumura | ............... | H04N 1/6052 358/1.9 |
| 6,034,667 A * | 3/2000 | Barrett | ............... | G09G 5/02 345/603 |
| 6,459,436 B1 * | 10/2002 | Kumada | ............... | G09G 5/02 345/589 |
| 6,804,568 B1 * | 10/2004 | Miyazaki | ............... | G05B 19/4097 700/17 |
| 6,999,617 B1 * | 2/2006 | Ohga | ............... | G06T 11/001 345/601 |
| 7,209,149 B2 * | 4/2007 | Jogo | ............... | G06F 3/0481 345/662 |
| 7,230,737 B1 * | 6/2007 | Ohga | ............... | H04N 1/6027 358/1.9 |
| 7,245,303 B2 * | 7/2007 | Yamashita | ............... | G06T 15/005 345/530 |
| 7,385,618 B2 * | 6/2008 | Yoshida | ............... | H04N 1/40025 347/184 |
| 7,679,795 B2 * | 3/2010 | Oki | ............... | G06K 15/02 358/1.9 |
| 8,104,896 B1 * | 1/2012 | Bilak | ............... | G09G 3/02 353/31 |
| 9,483,584 B2 * | 11/2016 | Batra | ............... | G06F 30/00 |
| 9,651,534 B1 * | 5/2017 | Ehlert | ............... | G01N 21/78 |
| 10,152,928 B2 * | 12/2018 | Funatsu | ............... | G09G 3/36 |
| 10,657,780 B1 * | 5/2020 | Kline | ............... | G08B 7/06 |
| 11,010,800 B2 * | 5/2021 | Norman | ............ | G06Q 30/0621 |
| 2002/0015044 A1 * | 2/2002 | Edge | ............... | H04N 9/69 345/600 |
| 2002/0051155 A1 * | 5/2002 | Fujioka | ............... | G06T 11/001 358/1.9 |
| 2002/0085752 A1 * | 7/2002 | Ohga | ............... | G06T 5/20 382/165 |
| 2002/0122191 A1 * | 9/2002 | Kitagawara | ............ | G06K 15/02 358/1.9 |
| 2003/0234794 A1 * | 12/2003 | Kanai | ............... | H04N 17/04 348/E9.037 |
| 2004/0085475 A1 * | 5/2004 | Skow | ............... | H04N 5/235 348/362 |
| 2004/0105105 A1 * | 6/2004 | Smith | ............... | H04N 1/6027 358/1.9 |
| 2004/0183828 A1 * | 9/2004 | Nichogi | ............... | G06F 3/14 715/745 |
| 2005/0078122 A1 * | 4/2005 | Ohga | ............... | H04N 1/6058 345/589 |
| 2005/0163370 A1 * | 7/2005 | Minakuti | ............... | H04N 1/603 382/167 |
| 2005/0271866 A1 * | 12/2005 | Lee | ............... | B41J 11/009 428/201 |
| 2007/0058181 A1 * | 3/2007 | Hatori | ............... | H04N 1/6052 358/1.9 |
| 2007/0058186 A1 * | 3/2007 | Tanaka | ............... | H04N 1/6088 358/1.9 |
| 2007/0211277 A1 * | 9/2007 | Kaneko | ............ | G03G 15/0121 358/1.14 |
| 2007/0247648 A1 * | 10/2007 | Brito | ............... | H04N 1/6019 358/1.9 |
| 2008/0037041 A1 * | 2/2008 | Hasegawa | ............ | H04N 1/6058 358/1.6 |
| 2008/0112026 A1 * | 5/2008 | Kishimoto | ............ | G06T 11/001 358/518 |
| 2008/0170269 A1 * | 7/2008 | Kaneko | ............... | H04N 1/32144 358/3.28 |
| 2008/0278747 A1 * | 11/2008 | Katsuno | ............... | B41J 2/325 358/1.15 |
| 2009/0096807 A1 * | 4/2009 | Silverstein | ............ | G06T 15/08 345/593 |
| 2009/0109214 A1 * | 4/2009 | Harvill | ............... | G06T 15/04 345/419 |
| 2009/0116070 A1 * | 5/2009 | Ichitani | ............... | H04N 1/6022 358/3.01 |
| 2009/0262130 A1 * | 10/2009 | Ramirez | ............... | G06T 11/001 345/595 |
| 2010/0086201 A1 * | 4/2010 | Muto | ............... | H04N 1/6091 382/162 |
| 2010/0110457 A1 * | 5/2010 | Kaneko | ............... | H04N 1/6086 358/1.9 |
| 2010/0118008 A1 * | 5/2010 | Matsuoka | ............ | G09G 5/026 345/207 |
| 2010/0277754 A1 * | 11/2010 | Arimura | ............... | G06T 11/001 358/1.9 |
| 2011/0149319 A1 * | 6/2011 | Muto | ............... | H04N 1/6033 358/1.9 |
| 2011/0164184 A1 * | 7/2011 | Avkarogullari | ........ | G06F 3/1431 345/506 |
| 2011/0255105 A1 * | 10/2011 | Hatori | ............... | G01J 3/02 358/1.9 |
| 2012/0320014 A1 * | 12/2012 | Longhurst | ............... | G09G 5/02 345/207 |
| 2013/0015245 A1 * | 1/2013 | Kurtz | ............... | G02F 1/15 235/487 |
| 2013/0016409 A1 * | 1/2013 | Kurtz | ............... | B41M 3/06 359/9 |
| 2013/0016415 A1 * | 1/2013 | Kurtz | ............... | B44F 1/08 359/244 |
| 2013/0094041 A1 * | 4/2013 | Takemura | ............ | H04N 1/6091 358/1.9 |

(56) References Cited

U.S. PATENT DOCUMENTS

| | | | |
|---|---|---|---|
| 2013/0128921 A1* | 5/2013 | Yeager | G01K 11/12 374/162 |
| 2013/0136474 A1* | 5/2013 | Itagaki | G03G 15/2039 399/49 |
| 2013/0156445 A1* | 6/2013 | Takemura | G03G 15/5062 399/15 |
| 2013/0162998 A1* | 6/2013 | Furuta | H04N 1/4076 356/402 |
| 2013/0176326 A1* | 7/2013 | Safaee-Rad | G09G 5/02 345/590 |
| 2013/0222822 A1* | 8/2013 | Kurtz | G03B 35/26 358/1.9 |
| 2013/0222904 A1* | 8/2013 | Kurtz | G03C 9/06 359/463 |
| 2013/0222905 A1* | 8/2013 | Kurtz | G02B 30/23 359/464 |
| 2013/0243451 A1* | 9/2013 | Hirota | H04N 1/0005 399/39 |
| 2013/0271779 A1* | 10/2013 | Suzuki | H04N 1/6058 358/1.9 |
| 2014/0055797 A1* | 2/2014 | Obayashi | G06K 15/1878 358/1.9 |
| 2014/0055818 A1* | 2/2014 | Akaishi | H04N 1/465 358/1.9 |
| 2014/0070461 A1* | 3/2014 | Pax | B29C 64/393 264/401 |
| 2014/0112672 A1* | 4/2014 | Itagaki | G03G 15/5062 399/15 |
| 2014/0125659 A1* | 5/2014 | Yoshida | H04N 1/00442 345/589 |
| 2014/0176969 A1* | 6/2014 | Yano | G06K 15/1868 358/1.9 |
| 2014/0232737 A1* | 8/2014 | Zhang | G02B 27/14 345/589 |
| 2015/0097855 A1* | 4/2015 | Dotan | G02C 13/003 345/593 |
| 2016/0054960 A1* | 2/2016 | Ito | G06F 3/1203 358/1.15 |
| 2016/0057314 A1* | 2/2016 | Morovic | H04N 1/00954 358/3.23 |
| 2016/0231670 A1* | 8/2016 | Takahashi | G03G 15/2039 |
| 2016/0234402 A1* | 8/2016 | Yamaguchi | H04N 1/54 |
| 2016/0247305 A1* | 8/2016 | Borg | G06T 11/001 |
| 2016/0275658 A1* | 9/2016 | Klein | H04N 9/67 |
| 2016/0321823 A1* | 11/2016 | Karasawa | H04N 5/232939 |
| 2016/0339643 A1* | 11/2016 | Dikovsky | B41M 5/0082 |
| 2016/0360071 A1* | 12/2016 | Matsui | H04N 1/6008 |
| 2017/0094126 A1* | 3/2017 | Isokawa | H04N 1/6044 |
| 2017/0103584 A1* | 4/2017 | Vats | G10L 15/22 |
| 2017/0200270 A1* | 7/2017 | Reicher | A61B 5/7271 |
| 2017/0210143 A1* | 7/2017 | Yamazaki | B41J 2/36 |
| 2017/0221449 A1* | 8/2017 | Drazek | G09G 5/005 |
| 2017/0361534 A1* | 12/2017 | Fernandez-Nieves | B29C 64/259 |
| 2018/0020127 A1* | 1/2018 | Kim | H04N 1/6077 |
| 2018/0048887 A1* | 2/2018 | Fujio | H04N 1/6027 |
| 2018/0075802 A1* | 3/2018 | Liu | G09G 3/3648 |
| 2018/0166030 A1* | 6/2018 | Liu | G09G 3/3696 |
| 2018/0239565 A1* | 8/2018 | Yamamoto | G06F 3/1208 |
| 2018/0253571 A1* | 9/2018 | Taketani | G06K 19/06093 |
| 2018/0330421 A1* | 11/2018 | Reynolds | G06Q 30/0629 |
| 2018/0361756 A1* | 12/2018 | Yoshikawa | B41J 2/33 |
| 2019/0014300 A1* | 1/2019 | Henry | H04N 9/646 |
| 2019/0020785 A1* | 1/2019 | Yazawa | H04N 1/46 |
| 2019/0028614 A1* | 1/2019 | De Paepe | H04N 1/6008 |
| 2019/0045085 A1* | 2/2019 | Dobashi | H04N 1/6027 |
| 2019/0266788 A1* | 8/2019 | Huynh-Thu | G06F 30/23 |
| 2019/0275820 A1* | 9/2019 | Shuto | B41M 5/46 |
| 2019/0301941 A1* | 10/2019 | Kawabata | G06T 1/00 |
| 2019/0329577 A1* | 10/2019 | Takahashi | B41M 5/392 |
| 2019/0371014 A1* | 12/2019 | Etoh | G01D 7/00 |
| 2020/0089150 A1* | 3/2020 | Tokuma | B65H 29/14 |
| 2020/0106927 A1* | 4/2020 | Tsuchiya | H04N 1/6027 |
| 2020/0139742 A1* | 5/2020 | Lister | B41M 3/14 |
| 2020/0147989 A1* | 5/2020 | Kurihara | B41M 7/0009 |
| 2020/0286423 A1* | 9/2020 | Yu | G09G 3/3208 |
| 2020/0304688 A1* | 9/2020 | Tsuji | H04N 1/0044 |
| 2021/0004987 A1* | 1/2021 | Matsuura | G06T 7/90 |
| 2021/0006686 A1* | 1/2021 | Luo | H04N 9/67 |
| 2021/0035334 A1* | 2/2021 | Kalyanasundram | G06T 7/194 |
| 2021/0142130 A1* | 5/2021 | Uratani | G06K 15/1882 |
| 2021/0206114 A1* | 7/2021 | Schramm | B33Y 10/00 |
| 2021/0279536 A1* | 9/2021 | Gondek | G06K 15/1878 |
| 2021/0314463 A1* | 10/2021 | Tejima | B41J 2/4753 |
| 2021/0329144 A1* | 10/2021 | Matsushima | H04N 1/54 |
| 2021/0366164 A1* | 11/2021 | Takase | G06T 11/001 |

FOREIGN PATENT DOCUMENTS

| | | |
|---|---|---|
| JP | 2016-020080 A | 2/2016 |
| JP | 2016-163060 A | 9/2016 |
| WO | 2006/119632 A1 | 11/2006 |

OTHER PUBLICATIONS

Office Action for JP Patent Application No. 2018-558898, dated Apr. 27, 2021, 04 pages of English Translation and 04 pages of Office Action.

* cited by examiner

[ FIG. 1 ]
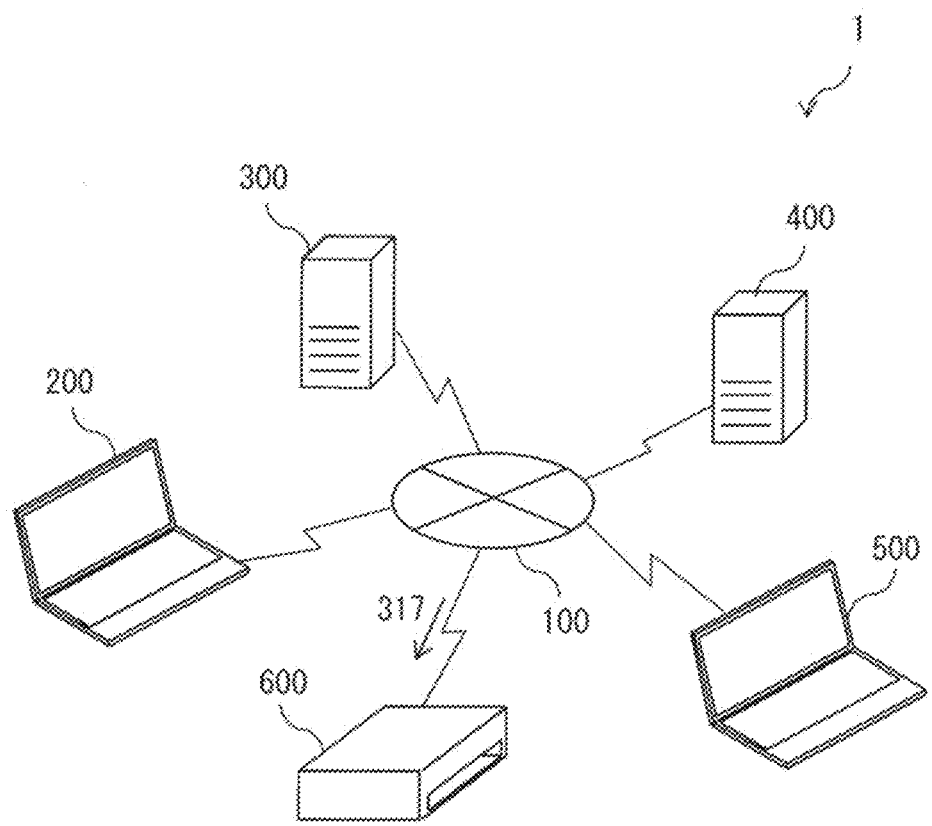
[ FIG. 2 ]
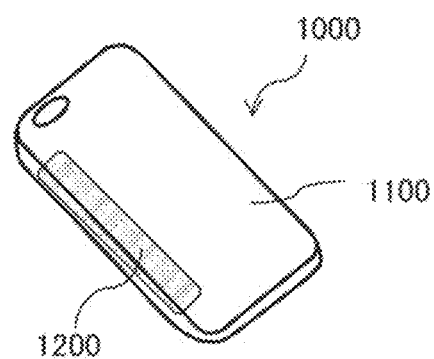

[FIG. 3]
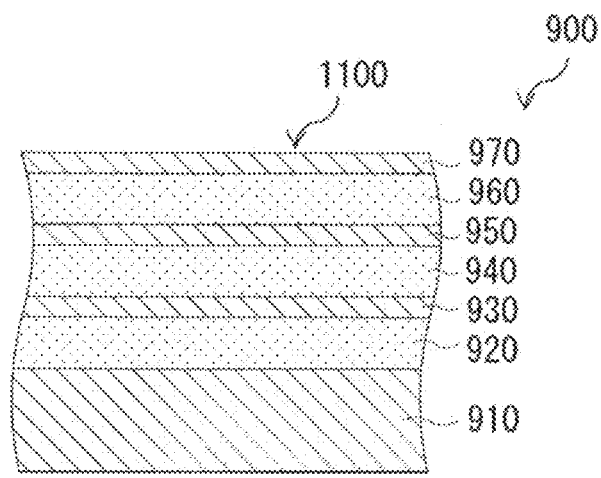
[FIG. 4]
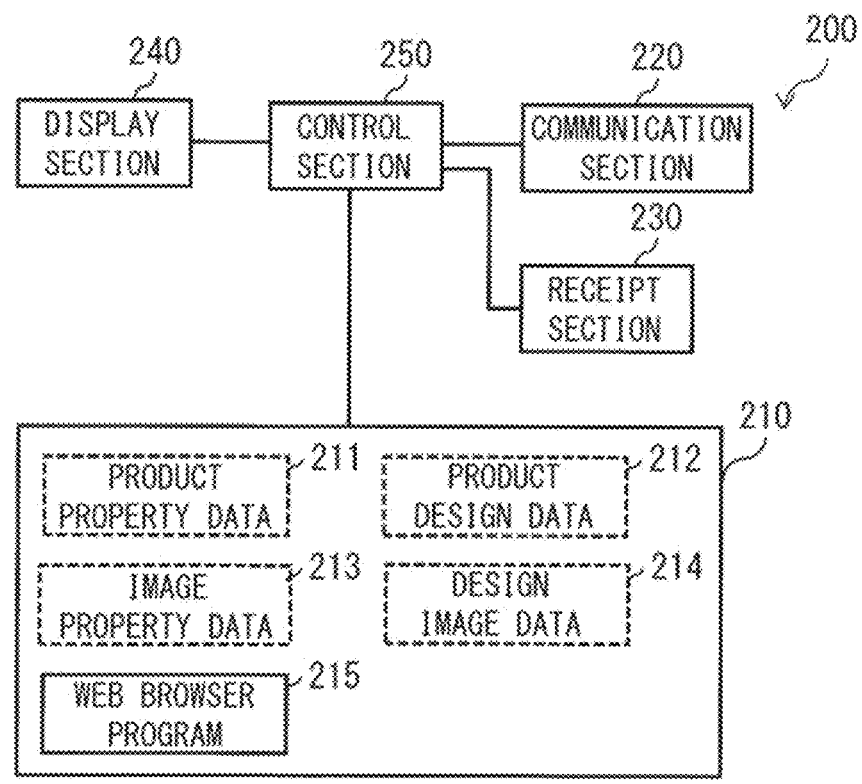

[FIG. 5]
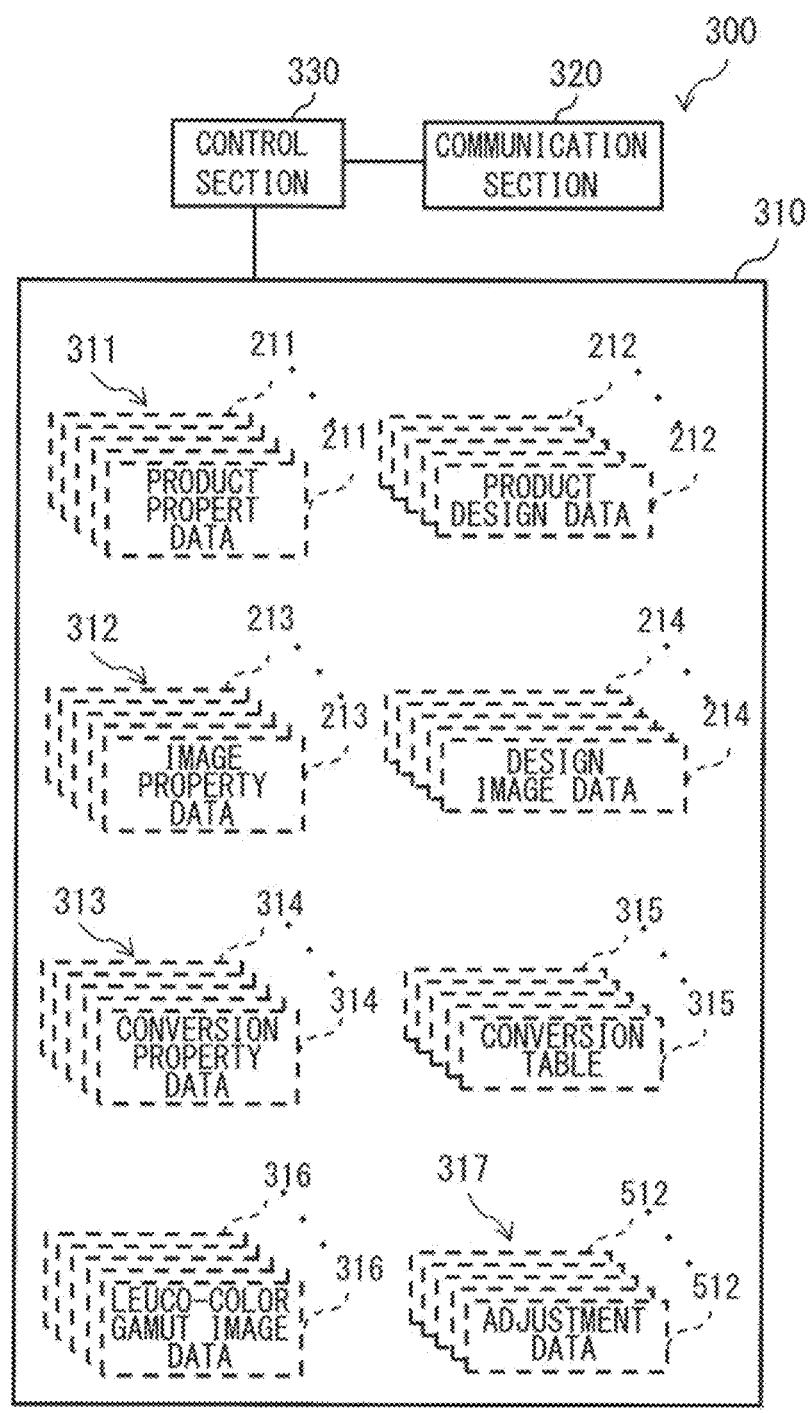

[FIG. 6]

| PRODUCT ID | PRODUCT NAME | MODEL NAME | DESIGN FILE NAME | COLOR SPACE | CHASSIS COLOR |
|---|---|---|---|---|---|
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |
| ... | ... | ... | ... | ... | ... |

[FIG. 7]

| IMAGE ID | TITLE | IMAGE FILE NAME | COLOR SPACE |
|---|---|---|---|
| ... | ... | ... | ... |
| ... | ... | ... | ... |
| ... | ... | ... | ... |
| ... | ... | ... | ... |
| ... | ... | ... | ... |
| ... | ... | ... | ... |

[FIG. 8]

| CONVERSION ID | PRODUCT ID | IMAGE ID | DISPLAY ENVIRONMENT | TABLE NAME |
|---|---|---|---|---|
| ... | ... | ... | ... | ... |
| ... | ... | ... | ... | ... |
| ... | ... | ... | ... | ... |
| ... | ... | ... | ... | ... |
| ... | ... | ... | ... | ... |
| ... | ... | ... | ... | ... |

[FIG. 9]

| ADJUSTMENT ID | COORDINATES | ORIENTATION | SCALE SIZE | COLOR TONE | |
|---|---|---|---|---|---|
| ... | ... | ... | ... | ... | ～512 |
| ... | ... | ... | ... | ... | |
| ... | ... | ... | ... | ... | |
| ... | ... | ... | ... | ... | |
| ... | ... | ... | ... | ... | |
| ... | ... | ... | ... | ... | ～512 |

317

[ FIG. 10 ]
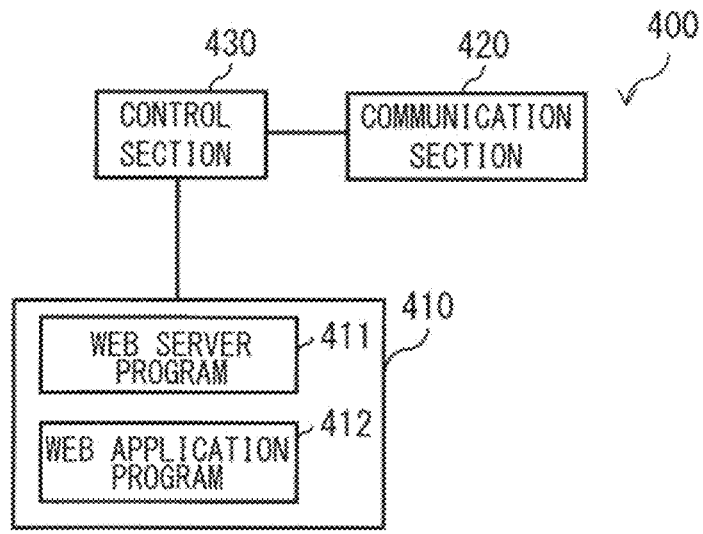
[ FIG. 11 ]
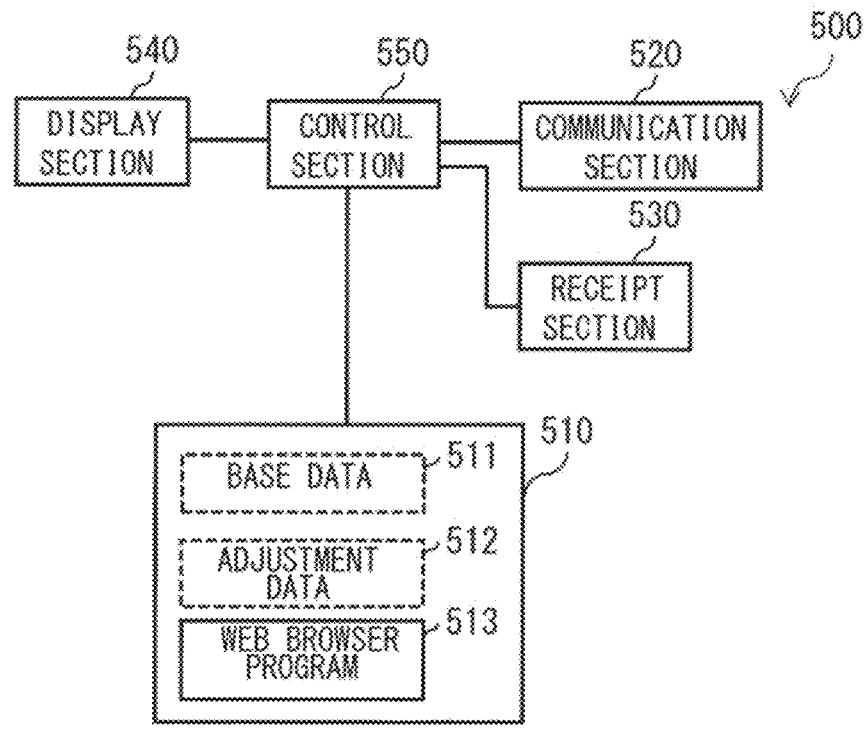

[FIG. 12]
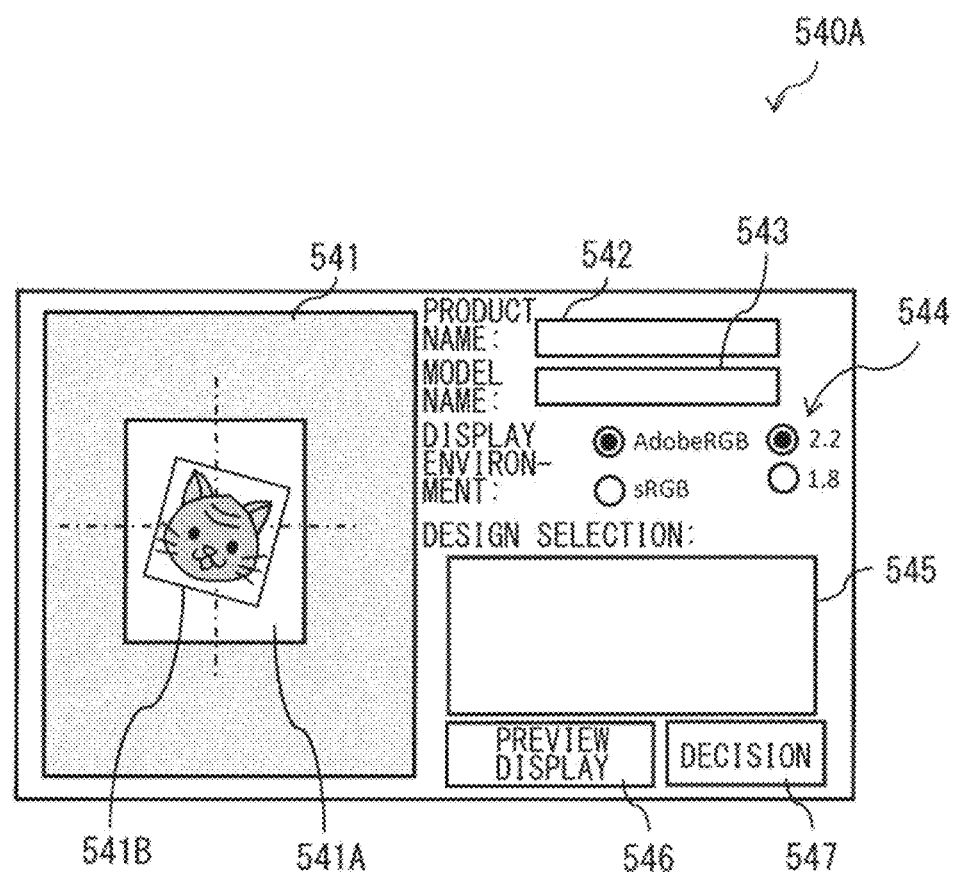

[FIG. 13]
REGISTRATION OF PRODUCT DATA
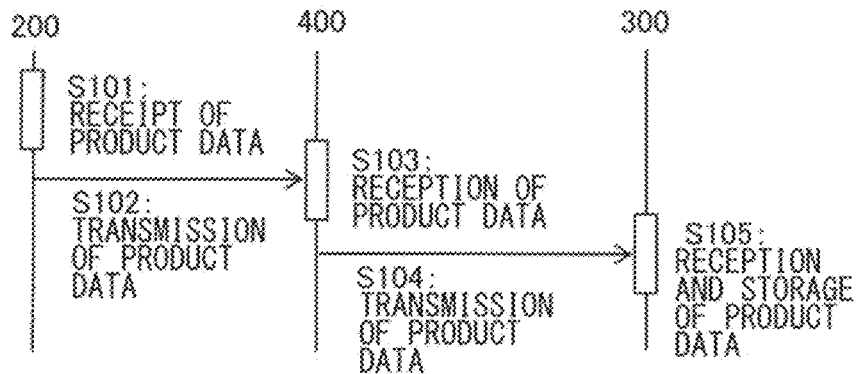
[FIG. 14]
REGISTRATION OF IMAGE DATA AND CONVERSION DATA
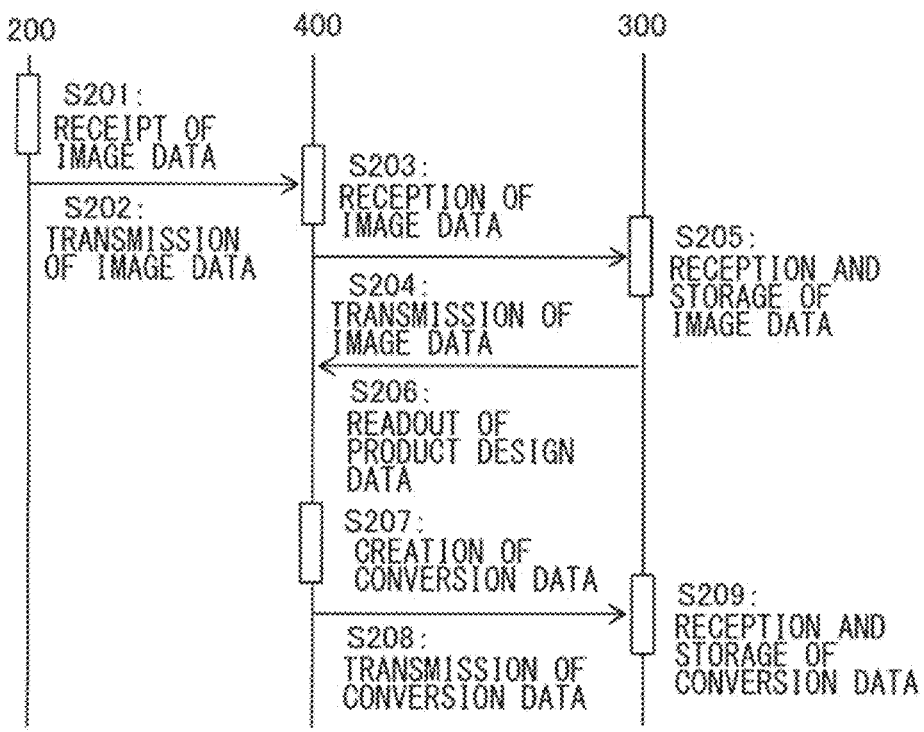

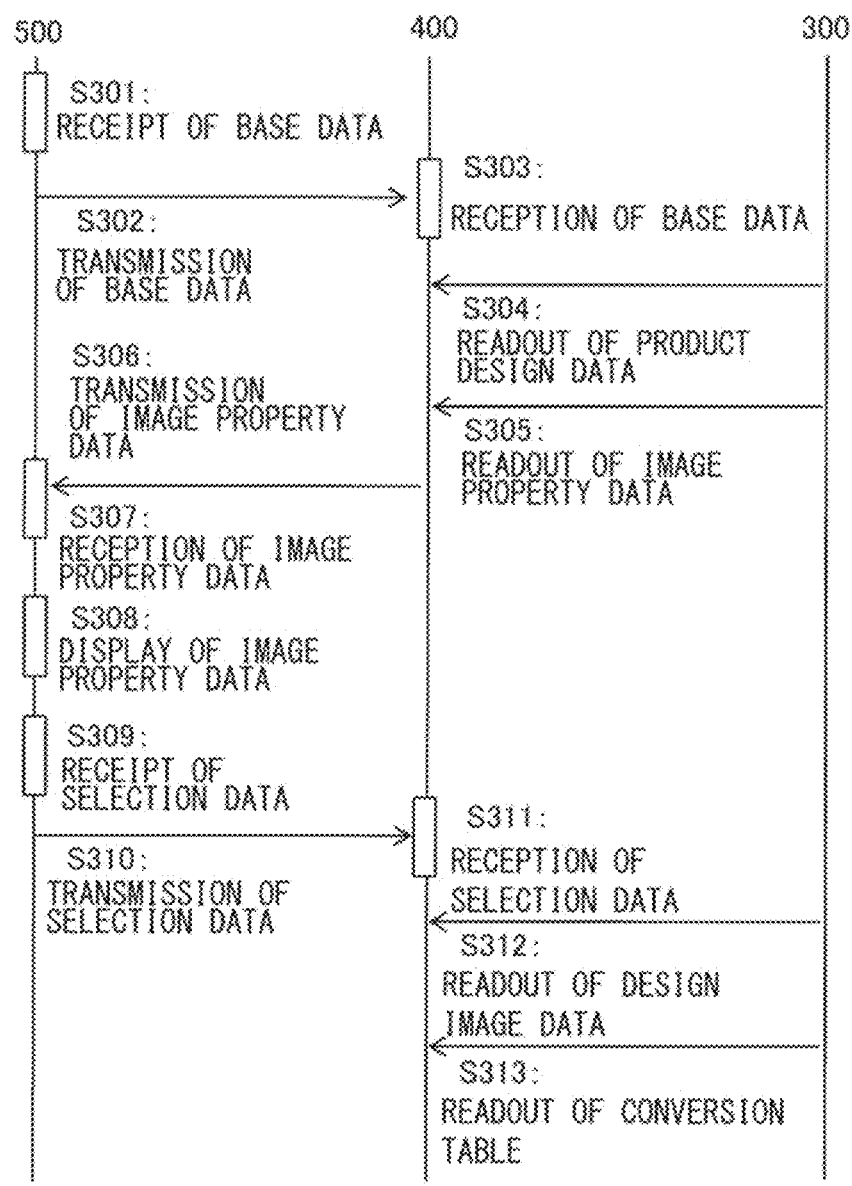

[ FIG. 16 ]
IMAGE ADJUSTMENT
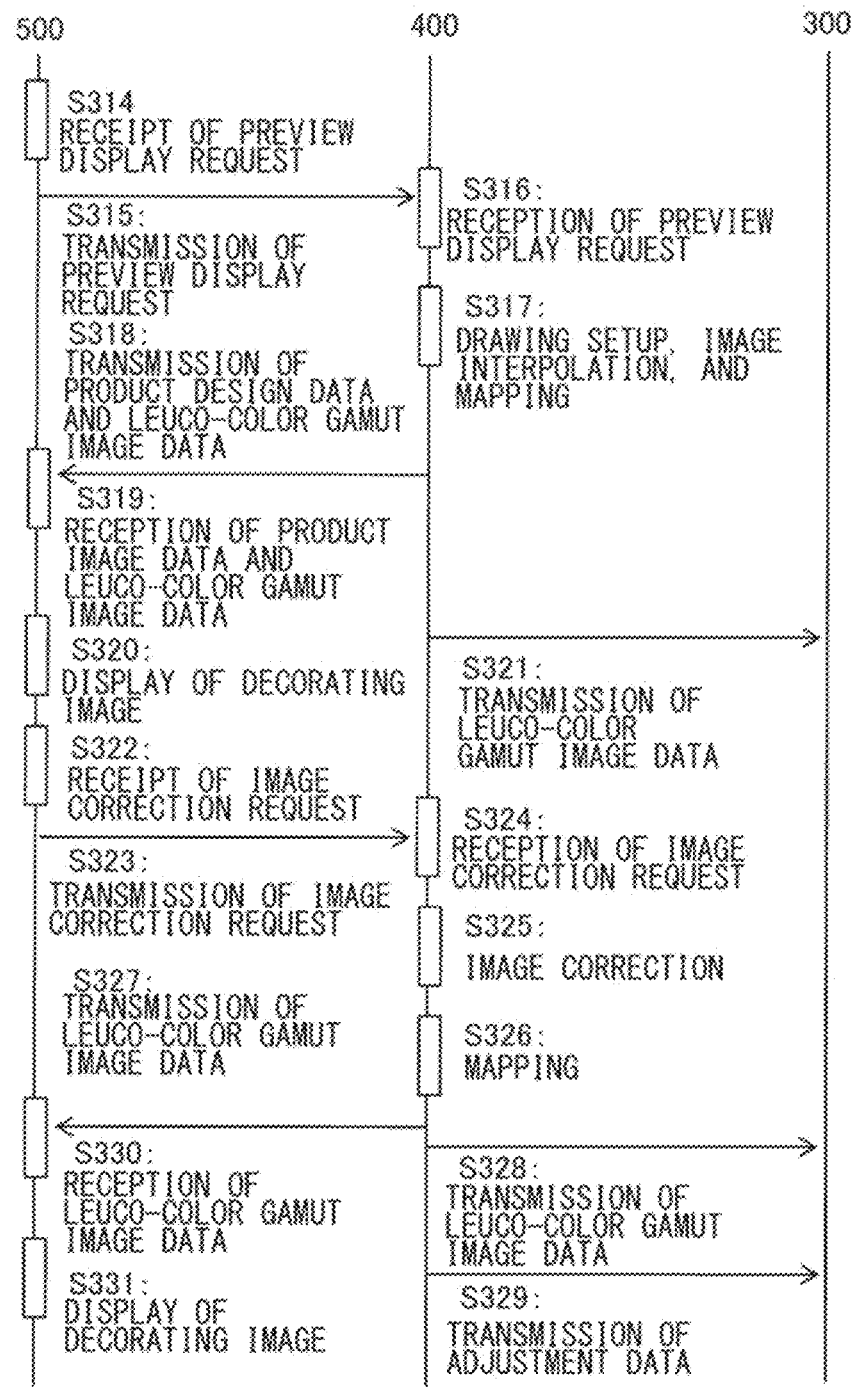

[FIG. 17]
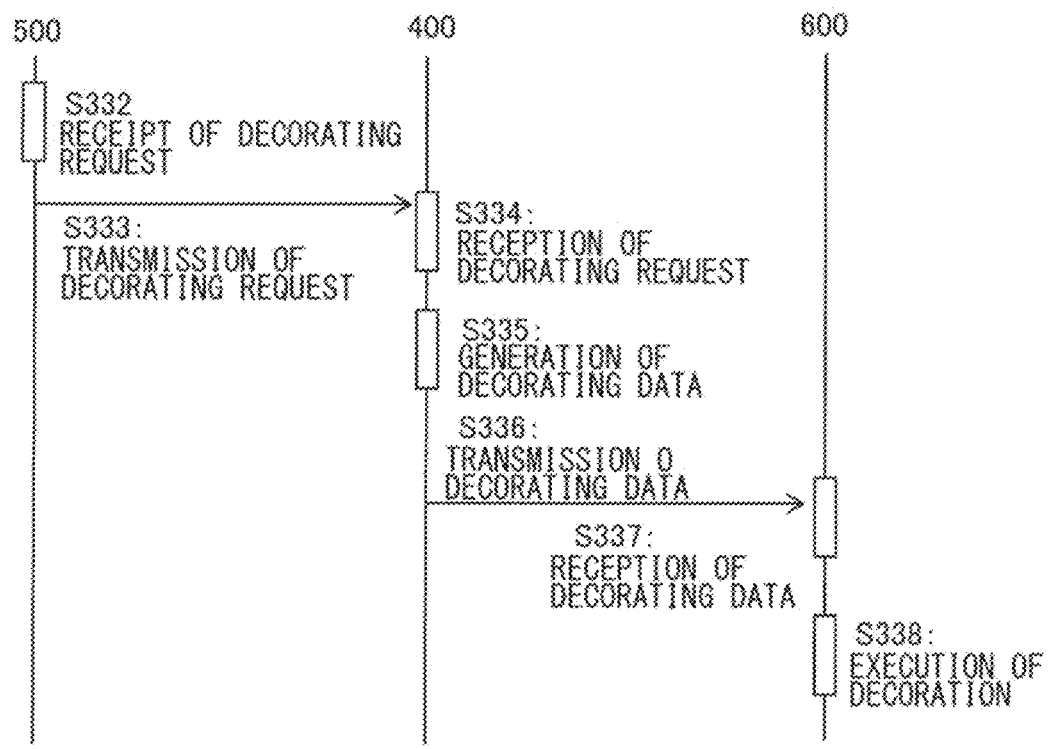

PRODUCT DESIGN SYSTEM AND DESIGN IMAGE CORRECTION APPARATUS

CROSS REFERENCE TO RELATED APPLICATIONS

This application is a U.S. National Phase of International Patent Application No. PCT/JP2017/041473 filed on Nov. 17, 2017, which claims priority benefit of Japanese Patent Application No. JP 2016-253578 filed in the Japan Patent Office on Dec. 27, 2016. Each of the above-referenced applications is hereby incorporated herein by reference in its entirety.

TECHNICAL FIELD

The present disclosure relates to a product design system and a design image correction apparatus.

BACKGROUND ART

Product design involves significant costs and expenses. In the product design, however, dyeing of materials and coloring of an external appearance are completed at relatively lower costs. Further, preparation of a large variation of colors and decorative designs makes it possible to fit in with a wide range of preferences of consumers, thereby allowing for an increase in the sales volume. Therefore, a large variation of colors and decorative designs has been prepared in a variety of product fields (for example, see NPL 1).

CITATION LIST

Non-Patent Literature

NPL 1: http://www.sony.jp/vaio-v/products/c151/

SUMMARY OF THE INVENTION

However, in a case where the number of variations of the colors and decorative designs is increased excessively, for example, a large stock of a product employing a given color and decorative design may possibly remain, which poses a possibility of a high stock risk. On the contrary, if the number of variations of the colors and decorative designs is decreased excessively, it is not easy to fit in with a wide range of preferences of consumers. It is therefore desirable to provide a product design system and a design image correction apparatus that make it possible to fit in with a wide range of preferences of consumers while avoiding the high stock risk.

A product design system according to an embodiment of the present disclosure includes a generating section, a correcting section, a first transmitting section, and a second transmitting section. The generating section uses first design image data to generate a look-up table converting a first color space into a second color space that is represented with a thermochromic material. The correcting section generates second design image data by performing at least one of drawing correction and color tone correction for the first design image data. The first transmitting section uses the look-up table to convert the second design image data into third design image data of the second color space, and transmits the third design image data derived from the conversion to an external apparatus. The second transmitting section converts the second design image data into fourth design image data of the second color space, and transmits a decorating request based on the fourth design image data derived from the conversion to a decorating apparatus.

In the product design system according to the embodiment of the present disclosure, the second design image data for which image correction is completed is converted into the third design image data of a color space that is represented with the thermochromic material using the look-up table. This reduces the amount of time involving profile transformation, which makes it possible to reduce the amount of time from an image correction request for the first design image data until acquisition of the third design image data. Further, in such a product design system, the third design image data is transmitted to an external apparatus, and a decorating request based on the forth design image data that is profile-transformed from the second design image data is transmitted to the decorating apparatus. As a result, for example, in requesting image correction for the first design image data, the third design image data for which image correction and profile transformation are completed is displayed on an external apparatus in a short time, which allows the decorating apparatus to perform decoration based on the forth design image data generated for decoration. In such a case, for example, a product chassis is provided with an information recording layer including the thermochromic material, and the decoration based on the forth design image data is performed onto the information recording layer. This makes it possible to decorate the product chassis with a design image tailored to suit preference and mood of a user. This eliminates the need to preliminarily prepare many products that are decorated with design images tailored to suit the preference and mood of the user.

A design image correction apparatus according to an embodiment of the present disclosure includes a first receipt section, a second receipt section, an acquisition section, and a third receipt section. The first receipt section receives selection of a first design image. The second receipt section receives at least one correction request of drawing correction and color tone correction for the first design image. The acquisition section acquires, as a third design image of a color space that is represented with a thermochromic material, a second design image equivalent to the first design image for which correction in accordance with a correction request is completed, and causes such a design image to be displayed on a display section. The third receipt section receives a decorating request for a design image corresponding to the third design image.

In the design image correction apparatus according to the embodiment of the present disclosure, at least one correction request of the drawing correction and the color tone correction is accepted for the received first design image. In addition, the second design image equivalent to the first design image for which correction in accordance with a correction request is completed is acquired as the third design image of a color space that is represented with the thermochromic material to be displayed on the display section. Further, a decorating request for the design image corresponding to the third design image is accepted. As a result, for example, in requesting image correction for the first design image, the third design image for which image correction and profile transformation are completed is displayed, which allows a decorating apparatus to perform decoration based on the design image generated for decoration. In such a case, for example, a product chassis is provided with an information recording layer including the thermochromic material, and decoration is performed onto the information recording layer. This makes it possible to decorate the product chassis with a design image tailored to suit preference and mood of a user. This eliminates the need to preliminarily prepare many products that are decorated with design images tailored to suit the preference and mood of the user.

Advantageous Effects of the Invention

According to the product design system and the design image correction apparatus of the respective embodiments of the present disclosure, on request for image correction, the design image for which image correction and profile transformation are completed is displayed, which allows decoration based on the design image generated for decoration to be performed onto the information recording layer in the product chassis. Therefore, it is possible to fit in with a wide range of preferences of consumers while avoiding the high stock risk. It is to be noted that effects of the present disclosure are not necessarily limited to the effects described above, and may include any of effects that will be described herein.

BRIEF DESCRIPTION OF DRAWINGS

FIG. 1 illustrates a simplified configuration example of a product design system according to an embodiment of the present disclosure.

FIG. 2 illustrates a perspective configuration example of a smartphone cover.

FIG. 3 illustrates a cross-sectional configuration example of an information recording layer.

FIG. 4 illustrates a functional block example of a terminal unit in FIG. 1.

FIG. 5 illustrates a functional block example of a data server unit in FIG. 1.

FIG. 6 illustrates a configuration example of a database in FIG. 5.

FIG. 7 illustrates a configuration example of a database in FIG. 5.

FIG. 8 illustrates a configuration example of a database in FIG. 5.

FIG. 9 illustrates a configuration example of a database in FIG. 5.

FIG. 10 illustrates a functional block example of a web server unit in FIG. 1.

FIG. 11 illustrates a functional block example of a terminal unit in FIG. 1.

FIG. 12 illustrates an example of a user interface.

FIG. 13 illustrates an example of registration steps of product data.

FIG. 14 illustrates an example of registration steps of leuco-color gamut image data.

FIG. 15 illustrates an example of image adjustment steps.

FIG. 16 illustrates an example of image adjustment steps following on the adjustment steps in FIG. 15.

FIG. 17 illustrates an example of decorating steps.

MODES FOR CARRYING OUT THE INVENTION

Hereinafter, some embodiments of the present disclosure will be described in detail with reference to the drawings. The following descriptions deal with a specific example of the present disclosure, and the present disclosure is not limited to the following aspects.

[Configuration]

Description is provided on a product design system 1 according to an embodiment of the present disclosure. FIG. 1 illustrates a simplified configuration example of the product design system 1 according to the embodiment of the present disclosure. The product design system 1 is a system that allows a user to be given a free choice of a design image of a product chassis to suit the user's own preference or mood. An example of a product that allows for selection of the design image with use of the product design system 1 includes a smartphone cover 1000 as illustrated in FIG. 2. It is to be noted that a product that is applicable to the product design system 1 is not limited to the smartphone cover 1000 illustrated in FIG. 2, and any product incorporating an information recording layer 900 to be described later is applicable to the product design system 1.

The smartphone cover 1000 is a cover serving to protect a smartphone. The smartphone cover 1000 is provided with a decorating surface 1100 on a surface thereof, and a design image 1200 is formed by performing decorative processing onto the decorating surface 1100. The decorating surface 1100 has the information recording layer 900 as illustrated in FIG. 3, for example. The decorative processing refers to a process of drawing (or printing) a design image onto a layer including a thermochromic material. An example of the layer including the thermochromic material includes the information recording layer 900 including a leuco dye.

The information recording layer 900 records a variety of design images in a visible manner through color generation with use of the leuco dye. The information recording layer 900 has, for example, a base substrate 910, recording layers 920, 940, and 960, heat-insulating layers 930 and 950, as well as a protective layer 970. The recording layer 920, the heat-insulating layer 930, the recording layer 940, the heat-insulating layer 950, the recording layer 960, and the protective layer 970 are disposed in this order on a surface of the base substrate 910.

The base substrate 910 functions as a substrate serving to dispose each of the layers on the surface thereof. The base substrate 910 may be light transmissive, or may not be light transmissive. In a case where the base substrate 910 is not light transmissive, a surface color of the base substrate 910 may be, for example, white, or may be any color other than the white color.

The recording layers 920, 940, and 960 allow their states to be changed reversibly between a colorizing state and a decolorizing state. The recording layers 920, 940, and 960 are configured in such a manner that colors in the colorizing state are different from one another. Specifically, in this example, the recording layer 920 is magenta color producible; the recording layer 940 is cyan color producible; and the recording layer 960 is yellow color producible. It is to be noted that the recording layers 920, 940, and 960 are not limited to the above-described examples, and the three recording layers 920, 940, and 960 and the three colors (the magenta color, the cyan color, and the yellow color) may correspond to one another in whatever method. Further, the recording layers 920, 940, and 960 become transparent in the decolorizing state. This allows the information recording layer 900 to record the design images using a color with a wide color gamut.

Each of the recording layers 920, 940, and 960 includes the leuco dye. In such a case, each of the recording layers 920, 940, and 960 includes, for example, a developer, a photothermal conversion material, and a polymer in addition to the leuco dye. The leuco dye is put in the colorizing state through the binding to the developer by heat, or is put in the decolorizing state by separating from the developer. The leuco dyes of the three recording layers 920, 940, and 960 are different from one another in the color in the colorizing state. The photothermal conversion material generates heat by absorbing infrared light. The photothermal conversion materials of the three recording layers 920, 940, and 960 are different from one another in the wavelength of the absorbed infrared light.

The heat-insulating layer 930 serves to make it less likely for heat to be transferred between the recording layer 920 and the recording layer 940. The heat-insulating layer 950 serves to make it less likely for heat to be transferred between the recording layer 940 and the recording layer 960. The protective layer 970 serves to protect a surface of the information recording layer 900. The heat-insulating layers 930 and 950, as well as the protective layer 970 are configured using transparent materials.

The above-described configuration makes it possible to record a variety of design images in a visible manner on the smartphone cover 1000. Specifically, in a case where a design image is recorded on the information recording layer 900, the information recording layer 900 is irradiated with infrared light on the basis of the design image. A wavelength of the infrared light is set to a wavelength depending on a color of the design image that is desired to be recorded. In each of the recording layers 920, 940, and 960, the photothermal conversion material generates heat by absorbing the infrared light of a wavelength corresponding to the photothermal conversion material. Thereafter, the leuco dye is put in the colorizing state through the binding to the developer by the heat generated by the photothermal conversion material, or is put in the decolorizing state by separating from the developer. In this way, the various design images are recorded in a visible manner on the smartphone cover 1000. Further, the smartphone cover 1000 also makes it possible to rewrite the design images recorded in in a visible manner.

The product design system 1 includes, for example, one or a plurality of terminal units 200 to be used by a product manufacturer, a data server unit 300, a web server unit 400, one or a plurality of terminal units 500 to be used by a product user, and a decorating unit 600. The one or the plurality of terminal units 200, the data server unit 300, the web server unit 400, the one or the plurality of terminal units 500, and the decorating unit 600 are coupled with respect to one another over a network 100. The one or each of the plurality of terminal units 500 corresponds to a specific example of a "design image correction apparatus" of the present technology.

The network 100 is, for example, a network that performs communication using a communication protocol (TCP/IP) in use typically on the Internet. The network 100 may be, for example, a secure network that performs communication using a communication protocol specific to the network. The network 100 is, for example, the Internet, an intranet, or a local area network. Coupling of the one or the plurality of terminal units 200, the data server unit 300, the web server unit 400, the one or the plurality of terminal units 500, or the decorating unit 600 to the network 100 may be made via, for example, a wired LAN (Local Area Network), a wireless LAN such as Wi-Fi, a mobile phone line, etc.

(Terminal Unit 200)

FIG. 4 illustrates a simplified configuration example of the terminal unit 200. The terminal unit 200 has, for example, a storage section 210, a communication section 220, a receipt section 230, a display section 240, and a control section 250. The display section 240 includes, for example, a liquid crystal panel, an organic EL panel, etc. The receipt section 230 is a user interface in the terminal unit 200, and is, for example, a GUI (Graphical User Interface) to be displayed on a display face of the display section 240.

The storage section 210 stores programs (for example, a web browser program 215 and an operating system) to be executed by the control section 250, etc. The storage section 210 stores, for example, product property data 211, product design data 212, image property data 213, and design image data 214.

The control section 250 includes a processor, and executes the web browser program 215, the operating system, etc. that are stored in the storage section 210. The communication section 220 performs communication with the other units (the web server unit 400, etc.) in the product design system 1 over the network 100. The user interface (the receipt section 230) in the terminal unit 200 is, for example, achieved by processing, using the web browser program 215, an application (for example, html data) acquired from the web server unit 400.

The control section 250 receives product data through the user interface (the receipt section 230). The product data includes, for example, the image property data 213 and the design image data 214. The product data is information entered in the terminal unit 200 by a user of the terminal unit 200 (for example, a personnel of a product manufacturer). Upon receipt of the product data, the control section 250 transmits the received product data to the web server unit 400.

The control section 250 receives image data through the user interface (the receipt section 230). The image data includes, for example, the image property data 213 and the design image data 214. The image data is information entered in the terminal unit 200 by a user of the terminal unit 200 (for example, a personnel of a product manufacturer). Upon receipt of the product data, the control section 250 transmits the received image data to the web server unit 400.

(Data Server Unit 300)

FIG. 5 illustrates a simplified configuration example of the data server unit 300. The data server unit 300 has, for example, a storage section 310, a communication section 320, and a control section 330. The control section 330 processes information incoming from the outside through the communication section 320, or outputs readout information from the storage section 310 to the outside through the communication section 320. The communication section 320 performs communication with other apparatuses over the network 100.

The storage section 310 includes, for example, non-volatile memories, and has, for example, an EEPROM (Electrically Erasable Programmable Read-Only Memory), a flash memory, a resistance random access memory, etc. The storage section 310 has, for example, databases organized orderly to facilitate retrieval and accumulation. The storage section 310 has, for example, databases 311, 312, 313, and 317. The database 311 stores the plurality of pieces of product property data 211 entered from the terminal unit 200. The database 312 stores the plurality of pieces of image property data 213 entered from the terminal unit 200. The database 313 stores a plurality of pieces of conversion property data 314 inputted from the web server unit 400. The database 317 includes a plurality of pieces of adjustment data 512.

FIG. 6 illustrates a configuration example of the database 311. FIG. 6 illustrates, in a schematic manner, how the plurality of pieces of product property data 211 are stored in the database 311. For example, a product ID (Identification) intended to identify the individual product property data 211 is added to each of the product property data 211. Each of the product property data 211 includes, for example, the product ID, a product name, a model name, a design file name, a color space, and a chassis color. The product name is information indicating a nomenclature of a product. The model name is information indicating the nomenclature of the product in a code form, and has a role as an identifier to identify a type and characteristics of the product. In some cases, it is also possible to determine from the model name a color of a chassis in the product. The design file name is a file name of the product design data 212. The product design data 212 is stored in the storage section 310. The product design data 212 includes product design data describing a shape, a size, a color, etc. of the product in a predetermined language, and a file name serving to identify the product design data. The color space is information on standards of the color space in the product design data 212. Typical examples of the standards of the color space include AdobeRGB and sRGB. The chassis color is information on a color of a chassis in the product. In a case where it is possible to determine from the model name the chassis color in the product, the chassis color may be omitted from the product property data 211.

FIG. 7 illustrates a configuration example of the database 312. FIG. 7 illustrates, in a schematic manner, how the plurality of pieces of image property data 213 are stored in the database 312. For example, an image ID intended to identify the individual image property data 213 is added to each of the image property data 213. Each of the image property data 213 includes, for example, the image ID, a title, an image file name, and a color space. The title is a sentence describing characteristics of a design image included in the design image data 214. The "characteristics of a design image" refer to, for example, information such as a color of the design image and characters included in the design image. The image file name is a file name of the design image data 214. The design image data 214 is stored in the storage section 310. The design image data 214 includes design image data serving to decorate a product chassis, and a file name serving to identify the design image data. The color space is information on the standards of the color space in the design image data 214.

FIG. 8 illustrates a configuration example of the database 313. FIG. 8 illustrates, in a schematic manner, how the plurality of pieces of conversion property data 314 are stored in the database 313. For example, a conversion ID intended to identify the individual conversion property data 314 is added to each of the conversion property data 314. Each of the conversion property data 314 includes, for example, the conversion ID, a product ID, an image ID, and a display environment of the terminal unit 500. The display environment of the terminal unit 500 includes information on the standards of a color space in display settings of the terminal unit 500. Typical examples of the standards of the color space include AdobeRGB and sRGB. The display environment of the terminal unit 500 may include information such as a gamma factor in display settings of the terminal unit 500. Each of the conversion property data 314 is assigned for each of combinations of the product ID, the image ID, and the display environment of the terminal unit 500. Further, each of the conversion property data 314 includes, for example, a table name. The table name is a table name of a conversion table 315. Each of the conversion property data 314 may include information on the gamma factor in display settings of the terminal unit 500.

The conversion table 315 is a look-up table for converting a design image to decorate a product chassis into an image of a CMY profile. Specifically, the conversion table 315 is a look-up table for converting the design image data 214 into leuco-color gamut image data 316. The leuco-color gamut image data 316 is image data to be derived by converting the design image data 214 into image data of the CMY profile. A color space of the leuco-color gamut image data 316 is specified in terms of a color gamut that is representable on the information recording layer 900.

The conversion table 315 is provided for each of combinations of the product ID, the image ID, and the display environment of the terminal unit 500. The conversion table 315 is a look-up table for converting the design image data 214 into image data of the CMY profile, and adding correction in consideration of an influence of a base (a chassis of a product corresponding to a product ID) to the image data of the CMY profile that is derived from the conversion. Further, the conversion table 315 is also a look-up table for converting the image data that has been subjected to the above-described correction into image data of a color space identical to that specified in the display environment of the terminal unit 500. Therefore, by performing mapping (gamut mapping) with use of the conversion table 315, design image of a given image ID, with which a chassis of a product corresponding to a given product ID is decorated, is represented in high-fidelity colors on a display of the terminal unit 500.

FIG. 9 illustrates a configuration example of the database 317. FIG. 9 illustrates, in a schematic manner, how the plurality of pieces of adjustment data 512 are stored in the database 317. For example, an adjustment ID intended to identify the individual adjustment data 512 is added to each of the adjustment data 512. Each of the adjustment data 512 includes, for example, coordinates, an orientation, a scale size, and a color tone. The coordinates refer to information on positional coordinates of a design image overlaid on a product chassis. The orientation is information on an orientation of the design image overlaid on the product chassis. The scale size is information on a scaling size of the design image overlaid on the product chassis. The color tone is information on adjustment of a color tone of the design image overlaid on the product chassis.

(Web Server Unit 400)

FIG. 10 illustrates a simplified configuration example of the web server unit 400. The web server unit 400 provides user interfaces in the terminal units 200 and 500, and performs predetermined processing for data received from the terminal units 200 and 500. The web server unit 400 has, for example, a storage section 410, a communication section 420, and a control section 430. The control section 430 corresponds to a specific example of any of a "generating section", a "correcting section", a "first transmitting section", and a "second transmitting section" of the present technology.

The communication section 420 performs communication with the other units (the terminal units 200 and 500, etc.) in the product design system 1 over the network 100. The storage section 410 includes, for example, non-volatile memories, and has, for example, an EEPROM, a flash memory, a resistance random access memory, etc. The storage section 410 stores programs to be executed by the control section 430 (for example, a web server program 411 and a web application program 412), etc. The web application program 412 is an application program to be used over the network 100. The web application program 412 runs in collaboration of the web server program 411 and a web browser program 513 to be described later. The control section 430 includes a processor, and executes, for example, the web server program 411, the web application program 412, etc. that are stored in the storage section 410. Functions of the control section 430 are achieved, for example, in such a manner that the web server program 411 and the web application program 412 are executed by the control section 430.

Specifically, the control section 430 receives product data from the terminal unit 200. The product data includes, for example, product property data 211' and product design data 212. The product property data 211' is data in which the product ID from the product property data 211' is excluded. This product data is information entered in the terminal unit 200 by a user of the terminal unit 200 (for example, a personnel of a product manufacturer). Upon receipt of this product data, the control section 430 gives the product ID to the product property data 211' to generate the product property data 211. Further, the control section 430 stores the generated product property data 211 and the received product design data 212 in the data server unit 300 (the storage section 310).

The control section 430 receives image data from the terminal unit 200. The image data includes, for example, image property data 213' and design image data 214. The image property data 213' is data in which the product ID from the image property data 213' is excluded. This image data is information entered in the terminal unit 200 by a user of the terminal unit 200 (for example, a personnel of a product manufacturer). Upon receipt of this image data, the control section 430 gives the product ID to the image property data 213' to generate the image property data 213. Further, the control section 430 stores the generated image property data 213 and the received design image data 214 in the data server unit 300 (the storage section 310).

Upon receipt of the image data, the control section 430 generates conversion data (a look-up table) for converting a color space (a first color space) into a color space (a second color space) to be represented with a leuco dye (a thermochromic material) by using image data (first design image data of the first color space). Specifically, the control section 430 uses the image data to generate the conversion data for converting the color space into the color space to be represented on the information recording layer 900. Upon receipt of the image data, the control section 430 creates the conversion data for each of the products and display environments. This conversion data includes, for example, the conversion property data 314 and the conversion table 315. Specifically, firstly, the control section 430 reads out the product design data 212 from the data server unit 300. Next, the control section 430 creates the conversion table 315 on the basis of the readout product design data 212, the design image data 214 received from the terminal unit 200, and one of the display environments that are adoptable as the terminal unit 500. In other words, the control section 430 generates the conversion table 315 in consideration of a base color for design decoration. At this point, the control section 430 creates the conversion table 315 for each of the display environments that are adoptable as the terminal unit 500. In other words, the control section 430 generates the conversion table 315 in consideration of the display environment of the terminal unit 500 (external apparatus). Further, the control section 430 creates the conversion table 315 for each of the product design data 212 included in the data server unit 300.

Further, the control section 430 creates the conversion property data 314 for each of the created conversion tables 315. Specifically, firstly, the control section 430 reads out the product property data 211 corresponding to the readout product design data 212 to extract the product ID included in the readout product property data 211. Next, the control section 430 creates conversion property data 314' that includes the extracted product ID, the image ID given to the image property data 213' received from the terminal unit 200, the display environment of the terminal unit 500, and a table name of the conversion table 315. Thereafter, the control section 430 creates the conversion property data 314 by giving a conversion ID to the created conversion property data 314'. The control section 430 stores the created conversion data in the data server unit 300 (the storage section 310).

The control section 430 receives base data 511 from the terminal unit 500. The base data 511 is information entered in the terminal unit 500 by a user of the terminal unit 500 (for example, a product user). The base data 511 includes, for example, a product name, a model name, and a display environment. Upon receipt of the base data 511, the control section 430 reads out the product design data 212 corresponding to the received base data 511 from the data server unit 300 (the storage section 310). For example, the control section 430 reads out the product property data 211 that is consistent with the product name and the model name included in the base data 511, and thereafter reads out the product property data 211 that is consistent with a design file name included in the readout product property data 211. The control section 430 generates product image data 212A corresponding to the product design data 212 on the basis of the product design data 212.

Upon receipt of the base data 511, the control section 430 further reads out the plurality of pieces of image property data 213 from the data server unit 300 (the storage section 310) to transmit such readout data to the terminal unit 500. The control section 430 receives selection of a design image (selection data) from the terminal unit 500. The selection data is, for example, an ID (an image ID) of an image that a user of the terminal unit 500 (for example, a product user) selects on the basis of the plurality of pieces of image property data 213 displayed on the terminal unit 500. The control section 430 reads out the design image data 214 corresponding to the received selection data (for example, the image ID) from the data server unit 300 (the storage section 310). Further, the control section 430 reads out the conversion property data 314 that is consistent with the received selection data (for example, the image ID) and the product ID included in the product property data 211 corresponding to the received base data 511. The control section 430 reads out the conversion table 315 that is consistent with the table name included in the readout conversion property data 314.

The control section 430 receives a preview display request from the terminal unit 500. Upon receipt of the preview display request, the control section 430 performs drawing setup, image interpolation, and mapping (gamut mapping). The drawing setup refers to setting of coordinates, an orientation, and a scale size of the design image data 214 at predetermined values (for example, initial values). The image interpolation refers to making a calculation for a predetermined pixel to determine to which pixel in an image before changes of the size and orientation of the design image data 214 each pixel in an image after changes of the size and orientation of the design image data 214 corresponds. An example of an image interpolation method includes a bi-cubic method (a bi-cubic convolution). The mapping refers to conversion of a color tone of an image derived after the image interpolation (the design image data 214) into a color tone that is representable with the leuco dye. The mapping uses the conversion table 315. For example, the control section 430 uses the conversion table 315 to generate the leuco-color gamut image data 316 from the image derived after the image interpolation (the design image data 214). Further, the control section 430 corrects the leuco-color gamut image data 316 to achieve high-fidelity color representation on a display corresponding to a display environment included in the received base data 511, for example. The control section 430 transmits the generated leuco-color gamut image data 316 (or the post-correction leuco-color gamut image data 316) and the product design data 212 corresponding to the received base data 511 to the terminal unit 500. The control section 430 stores the generated leuco-color gamut image data 316 in the data server unit 300 (the storage section 310).

Incidentally, the information recording layer 900 is configured to produce colors with use of subtractive color mixing utilizing a CMY color filter (hereinafter referred to as a "medium"). Therefore, a color gamut of a color that is representable by the information recording layer 900 depends on colorizing characteristics of the medium, and such a color gamut differs from a color space of the design image data 214. To reproduce color representation of the design image data 214 faithfully to the extent possible, it is necessary to perform mapping with use of a desired conversion algorism (rendering intent) to determine to which color that is representable by the information recording layer 900 each color in the design image data 214 corresponds. Calculation for such mapping involves a huge amount of time. Therefore, the conversion table 315 is used in the present embodiment. As for the rendering intent, various mapping calculation methods are considered. From the viewpoint of high-fidelity representation of a color tone, it is preferable to use a color-difference minimum for the mapping calculation. The color-difference minimum refers to mapping from each representing color in a design image to a corresponding leuco representing color located at the shortest distance on a uniform color space of $L^*a^*b^*$.

The control section 430 receives an image correction request from the terminal unit 500. Upon receipt of the image correction request, the control section 430 performs image correction. The image correction includes, for example, at least one of drawing correction and color tone correction. The drawing correction refers to setting of coordinates, an orientation, and a scale size of the design image data 214 at values entered in the terminal unit 500. The color tone correction refers to setting of a color tone of the design image data 214 at a value entered in the terminal unit 500. Upon receipt of the image correction request, the control section 430 performs correction for the design image data 214 on the basis of the image correction request inputted from the terminal unit 500. Specifically, the control section 430 performs at least one of the drawing correction and the color tone correction, thereby generating design image data 214' (second design image data) reflecting the image correction request. The control section 430 acquires the design image (the design image data 214') equivalent to the design image data 214 that has been subjected to correction in accordance with the image correction request as a design image (third design image data) of a color space that is representable with a leuco dye (a thermochromic material). Specifically, the control section 430 uses the conversion table 315 to convert the design image data 214' into the leuco-color gamut image data 316 (the third design image data). The control section 430 transmits the leuco-color gamut image data 316 derived from the conversion to the web server unit 400 and the terminal unit 500 (the external apparatus). The control section 430 stores, as the adjustment data 512, contents of the image correction (the coordinates, the orientation, the scale size, and the color tone) in the data server unit 300 (the storage section 310).

The control section 430 receives a decorating request from the terminal unit 500. Upon receipt of the decorating request, the control section 430 converts the design image data 214' into leuco-color gamut image data 317 (fourth design image data of a second color space). The control section 430 transmits the decorating request based on the leuco-color gamut image data 317 derived from the conversion to the decorating unit 600. For example, the control section 430 converts the leuco-color gamut image data 317 derived from the conversion into decorating data to transmit the resulting data to the decorating unit 600. It is to be noted that, in a case where the decorating unit 600 has a function of converting the leuco-color gamut image data 317 into the decorating data, the control section 430 may transmit the design image data 214 that is read from the data server unit 300 (the storage section 310) to the decorating unit 600.

(Terminal Unit 500)

FIG. 11 illustrates a simplified configuration example of the terminal unit 500. The terminal unit 500 has, for example, a storage section 510, a communication section 520, a receipt section 530, a display section 540, and a control section 550. The control section 550 corresponds to a specific example of any of a "first receipt section", a "second receipt section", an "acquisition section", and a "third receipt section" of the present technology. The display section 540 includes, for example, a liquid crystal panel, an organic EL panel, etc. The receipt section 530 is a user interface in the terminal unit 500, and is, for example, a GUI (Graphical User Interface) to be displayed on a display face of the display section 540. The storage section 510 stores programs (for example, a web browser program 513 and an operating system) to be executed by the control section 550, etc. The storage section 510 stores, for example, the base data 511 and the adjustment data 512.

The control section 550 includes a processor, and executes the web browser program 513, the operating system, etc. that are stored in the storage section 510. The communication section 520 performs communication with the other units (the web server unit 400, etc.) in the product design system 1 over the network 100. The user interface (the receipt section 530) in the terminal unit 500 is, for example, achieved by processing an application (for example, html data) acquired from the web server unit 400 using the web browser program 513.

FIG. 12 illustrates an example of a user interface 540A (the receipt section 530) in the terminal unit 500. The user interface 540A has, for example, a decorating image display window 541, a product information entry window 542, a model name information entry window 543, a display environment information entry window 544, a design information entry window 545, a preview display button 546, and a decision button 547.

The decorating image display window 541 is a window serving to display a decorating image in which a design image 541B is overlaid on a product image 541A. The decorating image is, for example, an image generated in such a manner that the design image 541B is overwritten on the product image 541A. The product image 541A is an image to be drawn on the basis of the product image data 212A. The design image 541B is an image to be generated on the basis of the leuco-color gamut image data 316. The decorating image display window 541 allows a view angle of the product image 541A to be adjusted by mouse cursor operation, for example. Further, the decorating image display window 541 allows, for example, a position, a size, an orientation, etc. of the design image 541B to be adjusted by the mouse cursor operation.

The product information entry window 542 is a window serving to enter a product name. The model name information entry window 543 is a window serving to enter a product model. Each of the product information entry window 542 and the model name information entry window 543 may have a function to display subsequent characters following on characters entered halfway as entry candidate characters. The design information entry window 545 is a window serving to display the plurality of pieces of image property data 213. The design information entry window 545 displays, for example, a title, etc., included in each of the image property data 213. The design information entry window 545 makes it possible to select the one or the plurality of pieces of image property data 213 from among the plurality of pieces of displayed image property data 213 by the mouse cursor operation, for example. The preview display button 546 is a button that causes the decorating image to be displayed on the decorating image display window 541 when a mouse is clicked on the preview display button 546, for example. The decision button 547 is a button that causes a decorating request of the design image 541B displayed on the decorating image display window 541 to be outputted to the decorating unit 600 when the mouse is clicked on the decision button 547, for example.

The control section 550 receives the base data 511 through the user interface 540A. The control section 550 transmits the received base data 511 to the web server unit 400. The control section 550 receives the plurality of pieces of image property data 213 from the web server unit 400 through the communication section 520. The control section 550 causes the plurality of pieces of received image property data 213 to be displayed through the user interface 540A (the design information entry window 545). The control section 550 receives selection (selection data) of the image property data 213 from a user of the terminal unit 500 through the user interface 540A (the design information entry window 545). The control section 550 transmits the received selection data to the web server unit 400.

The control section 550 receives a preview display request. The control section 550 receives the preview display request in such a manner that a mouse is clicked on the preview display button 546 on the user interface 540A, for example. The control section 550 transmits the received preview display request to the web server unit 400. The control section 550 receives, from the web server unit 400, the product image data 212A and the leuco-color gamut image data 316. The control section 550 generates a decorating image on the basis of the received product image data 212A and the leuco-color gamut image data 316, causing the resulting image to be displayed on the display section 540 through the user interface 540A (the decorating image display window 541). The control section 550 receives an image correction request. For example, the control section 550 receives the image correction request through the user interface 540A (the decorating image display window 541). The control section 550 transmits the received image correction request to the web server unit 400. The control section 550 receives a decorating request of the design image data 214'. For example, the control section 550 receives the decorating request through the user interface 540A (the decision button 547). The control section 550 transmits the received decorating request to the web server unit 400.

(Decorating Unit 600)

The decorating unit 600 performs decorative processing on the basis of a signal (decorating data) that is inputted from the web server unit 400. For example, the decorating unit 600 performs the decorative processing onto the decorating surface 1100 of the smartphone cover 1000 having the information recording layer 900. An example of the decorative processing in the decorating unit 600 includes processing of irradiating the information recording layer 900 including a leuco dye with a laser. The decorating data is in a data format suited for decorative processing onto the information recording layer 900 that includes the leuco dye. It is to be noted that, in a case where data entered in the decorating unit 600 includes the leuco-color gamut image data 316, the control section 340 performs the decorative processing by converting the leuco-color gamut image data 316 into the decorating data, for example.

[Operation]

Next, description is provided on processing steps of the product design system 1 according to the present embodiment.

(Registration of Product Data)

First, description is provided on registration steps of product data. The product data includes, for example, the image property data 213 and the design image data 214. FIG. 13 illustrates an example of the registration steps of the product data in the product design system 1.

A user of the terminal unit 200 (for example, a personnel of a product manufacturer) enters the product data through the user interface (the receipt section 230) of the terminal unit 200. Thereafter, the terminal unit 200 receives the product data through the user interface (the receipt section 230) of the terminal unit 200 (Step S101). The terminal unit 200 transmits the received product data to the web server unit 400 (Step S102).

The web server unit 400 receives the product data from the terminal unit 200 (Step S103). The web server unit 400 transmits the received product data to the data server unit 300 (Step S104). The data server unit 300 receives the product data to store the received product data in the storage section 310 (Step S105).

(Registration of Image Data and Conversion Data)

Next, description is provided on registration steps of image data and conversion data. The image data includes, for example, the image property data 213 and the design image data 214. The conversion data includes, for example, the conversion property data 314 and the conversion table 315. FIG. 14 illustrates an example of the registration steps of the image data and the conversion data in the product design system 1.

A user of the terminal unit 200 (for example, a personnel of a product manufacturer) enters the image data through the user interface (the receipt section 230) of the terminal unit 200. Thereafter, the terminal unit 200 receives the image data through the user interface (the receipt section 230) of the terminal unit 200 (Step S201). The terminal unit 200 transmits the received image data to the web server unit 400 (Step S202).

The web server unit 400 receives the image data from the terminal unit 200 (Step S203). The web server unit 400 transmits the received image data to the data server unit 300 (Step S204). The data server unit 300 receives the image data to store the received image data in the storage section 310 (Step S205).

At the time of receipt of the image data, the web server unit 400 reads out the product design data 212 from the data server unit 300 (Step S206). The web server unit 400 creates the conversion data on the basis of the readout product design data 212 and the design image data 214 received from the terminal unit 200 (Step S207). In other words, the web server unit 400 generates the conversion table 315 in consideration of a base color of decoration. At this point, the web server unit 400 creates the conversion table 315 for each of the display environments that are adoptable as the terminal unit 500. In other words, the web server unit 400 generates the conversion table 315 in consideration of the display environments of the terminal unit 500 (the external apparatus). Further, the web server unit 400 creates the conversion table 315 for each of the product design data 212 included in the data server unit 300. The web server unit 400 transmits the created conversion data to the data server unit 300 (the storage section 310) (Step S208). The data server unit 300 receives the conversion data to store the received conversion data in the storage section 310 (Step S209).

(Adjustment of Image)

Next, description is provided on image adjustment steps. Each of FIG. 15 and FIG. 16 illustrates an example of the image adjustment steps in the product design system 1.

A user of the terminal unit 500 (for example, a product user) enters the base data 511 through the user interface 540A of the terminal unit 500. The terminal unit 500 receives the base data 511 through the user interface 540A (Step S301). The terminal unit 500 transmits the received base data 511 to the web server unit 400 (Step S302). The web server unit 400 receives the base data 511 from the terminal unit 500 (Step S303). The web server unit 400 reads out, from the data server unit 300 (the storage section 310), the product design data 212 corresponding to the received base data 511 (Step S304). For example, the web server unit 400 reads out the product property data 211 that is consistent with a product name and a model name included in the base data 511, and further reads out the product design data 211 that is consistent with a design file name included in the readout product property data 211.

Upon receipt of the base data 511, the web server unit 400 further reads out the plurality of pieces of image property data 213 from the data server unit 300 (the storage section 310) (Step S305). The web server unit 400 transmits the plurality of pieces of readout image property data 213 to the terminal unit 500 (Step S306). The terminal unit 500 receives the plurality of pieces of image property data 213 from the web server unit 400 (Step S307). The terminal unit 500 displays the plurality of pieces of received image property data 213 through the user interface 540A (the design information entry window 545) (Step S308). The terminal unit 500 receives selection (selection data) of the image property data 213 by the user of the terminal unit 500 through the user interface 540A (the design information entry window 545) (Step S309). The terminal unit 500 transmits the received selection data (for example, an image ID) to the web server unit 400 (Step S310).

The web server unit 400 receives the selection data (for example, the image ID) from the terminal unit 500 (Step S311). The web server unit 400 reads out the design image data 214 corresponding to the received selection data (for example, the image ID) from the data server unit 300 (the storage section 310) (Step S312). The web server unit 400 further reads out the conversion property data 314 that is consistent with the received selection data (for example, the image ID) and a product ID included in the product property data 211 corresponding to the received base data 511. The web server unit 400 reads out the conversion table 315 that is consistent with a table name included in the readout conversion property data 314 (Step S313).

The terminal unit 500 receives a preview display request (Step S314). The terminal unit 500 receives the preview display request in such a manner that a mouse is clicked on the preview display button 546 on the user interface 540A, for example. The terminal unit 500 transmits the received preview display request to the web server unit 400 (Step S315).

The web server unit 400 receives the preview display request from the terminal unit 500 (Step S316). Upon receipt of the preview display request, the web server unit 400 performs drawing setup, image interpolation, and mapping (Step S317). The web server unit 400 transmits the leuco-color gamut image data 316 generated by the mapping and the product design data 212 corresponding to the received base data 511 to the terminal unit 500 (Step S318). The web server unit 400 stores the generated leuco-color gamut image data 316 in the data server unit 300 (the storage section 310) (Step S321).

The terminal unit 500 receives the product image data 212A and the leuco-color gamut image data 316 from the web server unit 400 (Step S319). The terminal unit 500 generates a decorating image on the basis of the received product image data 212A and leuco-color gamut image data 316, causing such a generated decorating image to be displayed on the display section 540 through the user interface 540A (the decorating image display window 541) (Step S320). The terminal unit 500 receives an image correction (Step S322). For example, the terminal unit 500 receives the image correction through the user interface 540A (the decorating image display window 541). The terminal unit 500 transmits the received image correction to the web server unit 400 (Step S323).

The web server unit 400 receives the image correction request from the terminal unit 500 (Step S324). The image correction request includes, for example, at least one data of drawing correction and color tone correction. Upon receipt of the image correction request, the web server unit 400 performs correction for the design image data 214 on the basis of the image correction request inputted from the terminal unit 500 (Step S325). Specifically, the web server unit 400 performs at least one of the drawing correction and the color tone correction for the received design image data 214, thereby generating the design image data 214' reflecting the image correction request (the second design image data). Next, the web server unit 400 performs mapping (Step S326). Specifically, the web server unit 400 acquires the design image (the design image data 214') equivalent to the design image data 214 that has been subjected to correction in accordance with the image correction request as a design image (third design image data) of a color space that is representable with a leuco dye (a thermochromic material). More specifically, the web server unit 400 uses the conversion table 315 to convert the design image data 214' into the leuco-color gamut image data 316 (the third design image data). The web server unit 400 transmits the leuco-color gamut image data 316 derived from the conversion to the web server unit 400 and the terminal unit 500 (the external apparatus) (Steps S327 and S328). The web server unit 400 stores contents of the image correction (coordinates, an orientation, a scale size, and a color tone) in the data server unit 300 (the storage section 310) as the adjustment data 512 (Step S329). The terminal unit 500 receives the leuco-color gamut image data 316 derived from the image correction from the web server unit 400 (Step S330). The terminal unit 500 generates a decorating image on the basis of the product design data 212 and the received leuco-color gamut image data 316 to display the generated decorating image through the user interface 540A (the decorating image display window 541) (Step S331).

(Decoration)

Next, description is provided on decorating steps. A user of the terminal unit 500 (for example, a product user) enters a decorating request through the terminal unit 500. The user of the terminal unit 500 (for example, the product user) enters the decorating request in the terminal unit 500 by clicking on the decision button 547 on the user interface 540A, for example. The terminal unit 500 receives the decorating request for the design image data 214' through the user interface 540A (Step S332). The terminal unit 500 transmits the received decorating request to the web server unit 400 (Step S333). The web server unit 400 receives the decorating request from the terminal unit (Step S334).

Upon receipt of the decorating request, the web server unit 400 converts the design image data 214' into the leuco-color gamut image data 317, and transmits the decorating request based on the leuco-color gamut image data 317 derived from the conversion to the decorating unit 600. Specifically, at the time of receipt of the decorating request, the web server unit 400 converts the design image data 214' into the leuco-color gamut image data 317, and converts the leuco-color gamut image data 317 derived from the conversion into decorating data (Step S335). The web server unit 400 transmits the generated decorating data to the decorating unit 600 (Step S336). The decorating unit 600 receives the decorating data (Step S337). The decorating unit 600 performs decoration based on the received decorating data in predetermined timing on the information recording layer 900 that is provided in a product chassis (Step S338).

It is to be noted that, in a case where the decorating unit 600 has a function of converting the leuco-color gamut image data 317 into the decorating data, the web server unit 400 may transmit the leuco-color gamut image data 317 derived from the design image data 214' to the decorating unit 600 at the time of receipt of the decorating request. At this point, the decorating unit 600 converts the received leuco-color gamut image data 317 into the decorating data to perform decoration.

[Effects]

Next, description is provided on effects of the product design system 1 according to the present embodiment.

Product design involves significant costs and expenses. In the product design, however, dyeing of materials and coloring of an external appearance are completed at relatively lower costs. Further, preparation of a large variation of colors and decorative designs makes it possible to fit in with a wide range of preferences of consumers, thereby allowing for an increase in the sales volume. Therefore, a large variation of colors and decorative designs has been prepared in a variety of product fields.

However, in a case where the number of variations of the colors and decorative designs is increased excessively, for example, a large stock of a product employing a given color and decorative design may possibly remain, which poses a possibility of a high stock risk. On the contrary, if the number of variations of the colors and decorative designs is decreased excessively, it is not easy to fit in with a wide range of preferences of consumers.

In contrast, in the product design system 1 according to the present embodiment, the design image data 214' for which image correction is completed is converted into the leuco-color gamut image data 316 of a color space that is represented with a leuco dye (a thermochromic material) using the conversion table 315. This reduces the amount of time involving profile transformation, which makes it possible to reduce the amount of time from an image correction request for the design image data 214 until acquisition of the leuco-color gamut image data 316. Further, in the product design system 1, the leuco-color gamut image data 316 is transmitted to the terminal unit 500, and a decorating request based on the leuco-color gamut image data 317 that is profile-transformed from the design image data 214' is transmitted to the decorating unit 600. As a result, for example, in requesting image correction for the design image data 214, the leuco-color gamut image data 316 for which image correction and profile transformation are completed is displayed on the terminal unit 500 in a short time, which allows the decorating unit 600 to perform decoration based on the leuco-color gamut image data 317 generated for decoration. At this point, for example, a product chassis is provided with the information recording layer 900 including the thermochromic material, and the decoration based on the leuco-color gamut image data 317 is performed onto the information recording layer 900. This makes it possible to decorate the product chassis with a design image tailored to suit preference and mood of a user. This eliminates the need to preliminarily prepare many products that are decorated with design images tailored to suit the preference and mood of the user. Taken all of this into account, in the present embodiment, it is possible to fit in with a wide range of preferences of consumers while avoiding the high stock risk.

Further, in the present embodiment, the conversion table 315 is generated in consideration of a base color of decoration. Even in a case where the information recording layer 900 includes a material that is likely to become transparent, this makes it possible to faithfully reproduce a color that is visible actually on a product on the display section 540.

Additionally, in the present embodiment, the conversion table 315 is generated in consideration of a display environment of the terminal unit 500. This makes it possible to faithfully reproduce a color that is visible actually on a product on the display section 540.

Moreover, in the present embodiment, the information recording layer 900 includes the leuco dye. This makes it possible to put the information recording layer 900 in a colorizing state or a decolorizing state by irradiating the information recording layer 900 with infrared light. As a result, this allows for rewriting design images repeatedly onto the information recording layer 900, which makes it possible to decorate a product chassis with a design image tailored to suit preference and mood of a user.

Further, in the present embodiment, at least one correction request of drawing correction and color tone correction is accepted for the received design image data 214. In addition, the design image data 214' equivalent to the design image data 214 for which correction in accordance with a correction request is completed is acquired as the leuco-color gamut image data 316 of a color space that is represented with the thermochromic material to be displayed on the display section 540. Further, a decorating request for the design image (the design image data 214') corresponding to the leuco-color gamut image data 316 is accepted. As a result, for example, in requesting image correction for the design image data 214, the leuco-color gamut image data 316 for which image correction and profile transformation are completed is displayed, which allows the decorating unit 600 to perform decoration based on the leuco-color gamut image data 317 generated for decoration. In such a case, for example, a product chassis is provided with the information recording layer 900 including the thermochromic material, and the decoration based on the leuco-color gamut image data 317 is performed onto the information recording layer 900. This makes it possible to decorate the product chassis with a design image tailored to suit preference and mood of a user. This eliminates the need to preliminarily prepare many products that are decorated with design images tailored to suit the preference and mood of the user. Taken all of this into account, in the present embodiment, it is possible to fit in with a wide range of preferences of consumers while avoiding the high stock risk.

Further, in the present embodiment, the product image 541A corresponding to the base data 511 is acquired, and a decorating image with the leuco-color gamut image data 316 overlaid on the product image 541A is displayed on the display section 540. This makes it possible to faithfully reproduce a color that is visible actually on a product on the display section 540.

The present disclosure is described thus far with reference to the embodiment and modification examples thereof; however, the present disclosure is not limited to the above-described embodiment, etc., but various modifications may be made. It is to be noted that the effects described herein are merely exemplified. The effects of the present disclosure are not limited to the effects described herein. The present disclosure may have any effects other than those described herein.

Further, for example, the present disclosure may be configured as follows.

(1)
A product design system including:
a generating section that uses first design image data to generate a look-up table converting a first color space into a second color space that is represented with a thermochromic material;
a correcting section that generates second design image data by performing one or more of drawing correction and color tone correction for the first design image data;
a first transmitting section that uses the look-up table to convert the second design image data into third design image data of the second color space, and transmits the third design image data derived from the conversion to an external apparatus; and
a second transmitting section that converts the second design image data into fourth design image data of the second color space, and transmits a decorating request based on the fourth design image data derived from the conversion to a decorating apparatus.

(2)
The product design system according to (1), in which the generating section generates the look-up table in consideration of a base color of the decoration.

(3)
The product design system according to (1) or (2), in which the correcting section performs correction for the first design image data on the basis of a correction request inputted from an external apparatus, and the generating section generates the look-up table in consideration of a display environment of the external apparatus.

(4)
The product design system according to any one of (1) to (3), in which the thermochromic material is a leuco dye.

(5)
A design image correction apparatus including:
a first receipt section that receives selection of a first design image;
a second receipt section that receives one or more correction requests of drawing correction and color tone correction for the first design image;
an acquisition section that acquires, as a third design image of a color space that is represented with a thermochromic material, a second design image equivalent to the first design image for which correction in accordance with a correction request is completed, and that causes such a design image to be displayed on a display section; and
a third receipt section that receives a decorating request for a design image corresponding to the third design image.

(6)
The design image correction apparatus according to (5), in which
the first receipt section further receives base data of a product, and the acquisition section acquires a product image corresponding to the base data, and causes a decorating image with the third design image overlaid on the product image to be displayed on the display section.

This application claims the priority on the basis of Japanese Patent Application No. 2016-253578 filed on Dec. 27, 2016 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A product design system, comprising:
a processor configured to:
receive first design image data of a first color space and information associated with a display environment of an external apparatus, wherein the display environment of the external apparatus includes information related to one of a color space or a gamma factor of a display screen of the external apparatus;
generate a look-up table for conversion of the first color space into a second color space, wherein the generation of the look-up table is based on the first design image data and the information associated with the display environment of the external apparatus, and the second color space is represented with a thermochromic material;
receive a correction request from the external apparatus;
execute, based on the correction request, a correction process including at least one of a drawing correction or a color tone correction on the first design image data to generate second design image data;
convert the second design image data into third design image data of the second color space based on the generated look-up table;
control transmission of the third design image data to the external apparatus;
receive a decorating request from the external apparatus;
convert the second design image data into fourth design image data of the second color space based on the received decorating request; and
control transmission of the fourth design image data to a decorating apparatus for decoration of a surface of a product, where the decorating apparatus is different from the external apparatus.

2. The product design system according to claim 1, wherein the processor is further configured to generate the look-up table based on a base color of the decoration of the surface of the product.

3. The product design system according to claim 1, wherein the thermochromic material comprises a leuco dye.

4. The product design system according to claim 1, wherein the processor is further configured to:
   receive information indicating a value of one of an orientation or a scale size of the first design image data from the external apparatus; and
   execute the drawing correction based on the value of the one of the orientation or the scale size of the first design image data.

5. The product design system according to claim 1, further comprising the decorating apparatus, wherein the decorating apparatus is configured to:
   convert the fourth design image data into decorating data; and
   execute a decorative process on the surface of the product based on the decorating data.

6. A design image correction apparatus) comprising:
   a display screen; and
   a processor configured to:
      receive base data of a product;
      transmit a first design image of a first color space to an external apparatus;
      transmit information associated with a display environment of the display screen to the external apparatus, wherein the display environment includes information related to one of a color space or a gamma factor of the display screen, and a look-up table is generated by the external apparatus to convert the first color space into a second color space based on the first design image and the information associated with the display environment of the display screen;
      transmit a correction request including at least one of a drawing correction or a color tone correction for the first design image, wherein a second design image is generated by execution of the at least one of the drawing correction or the color tone correction on the first design image by the external apparatus in accordance with the correction request, the second design image is converted into a third design image of the second color space based on the look-up table generated by the external apparatus, and the second color space is represented with a thermochromic material;
      acquire the third design image from the external apparatus;
      control display of a specific design image corresponding to the third design image on the display screen; and
      transmit a decorating request for the specific design image corresponding to the third design image to the external apparatus.

7. The design image correction apparatus according to claim 6, wherein the processor is first receipt section further configured to:
   acquire a product image corresponding to the base data; and
   control display of a decorating image on the display screen, wherein the decorating image includes the third design image overlaid on the product image.

* * * * *